(12) United States Patent
Sohn et al.

(10) Patent No.: US 7,480,776 B2
(45) Date of Patent: Jan. 20, 2009

(54) CIRCUITS AND METHODS FOR PROVIDING VARIABLE DATA I/O WIDTH FOR SEMICONDUCTOR MEMORY DEVICES

(75) Inventors: Han-gu Sohn, Suwon (KR); Hai-jeong Sohn, Suwon (KR); Sei-jin Kim, Seongnam (KR); Woo-seop Jeong, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 316 days.

(21) Appl. No.: 10/732,868

(22) Filed: Dec. 10, 2003

(65) Prior Publication Data

US 2005/0071582 A1    Mar. 31, 2005

(30) Foreign Application Priority Data

Sep. 26, 2003    (KR) .................. 10-2003-0066944

(51) Int. Cl.
*G06F 12/00*    (2006.01)
(52) U.S. Cl. .................. 711/154; 365/189.011
(58) Field of Classification Search .......... 711/154; 365/230.01, 189.01, 220
See application file for complete search history.

(56) References Cited

U.S. PATENT DOCUMENTS

| | | | | |
|---|---|---|---|---|
| 4,660,181 A | | 4/1987 | Saito et al. .................. 365/230 |
| 4,706,219 A | * | 11/1987 | Miyata et al. ............ 365/189.08 |
| 4,783,730 A | * | 11/1988 | Fischer ........................ 710/5 |
| 5,349,448 A | * | 9/1994 | Hirai ........................... 358/444 |
| 5,408,628 A | | 4/1995 | Ameti .......................... 395/425 |
| 5,426,606 A | * | 6/1995 | Takai ....................... 365/189.05 |
| 5,504,875 A | * | 4/1996 | Mills et al. .................... 711/171 |
| 5,673,396 A | * | 9/1997 | Smolansky et al. .......... 710/307 |
| 5,699,544 A | * | 12/1997 | Robbins et al. .............. 711/212 |
| 5,829,007 A | * | 10/1998 | Wise et al. ...................... 711/5 |
| 5,923,591 A | * | 7/1999 | Kimura et al. .......... 365/189.01 |
| 5,935,428 A | * | 8/1999 | Yamamoto et al. ............ 210/128 |
| 6,052,330 A | * | 4/2000 | Tanabe ........................ 365/233 |
| 6,119,213 A | * | 9/2000 | Robbins ...................... 711/202 |
| 6,141,721 A | * | 10/2000 | Patterson et al. ............... 711/1 |
| 6,351,423 B2 | * | 2/2002 | Ooishi ......................... 365/207 |
| 6,404,770 B1 | * | 6/2002 | Fujimori et al. .............. 370/429 |
| 6,558,967 B1 | * | 5/2003 | Wong ........................... 438/17 |

(Continued)

FOREIGN PATENT DOCUMENTS

JP    61000992 A    6/1986

(Continued)

OTHER PUBLICATIONS

Office Action from the German Patent Office corresponding to German patent application 03-66944 dated Oct. 20, 2008.

*Primary Examiner*—Matt Kim
*Assistant Examiner*—Ryan Dare
(74) *Attorney, Agent, or Firm*—F. Chau & Assoc., LLC

(57) ABSTRACT

Circuits and methods for controlling data I/O operations in semiconductor memory devices to provide variable data I/O widths for read, write and active memory operations. Circuits and methods for selectively controlling a data width of a data I/O buffer "on the fly" to enable variable data I/O widths during memory access operations.

23 Claims, 15 Drawing Sheets

U.S. PATENT DOCUMENTS

| | | | | |
|---|---|---|---|---|
| 6,751,160 B1 * | 6/2004 | Murata | ........................ | 365/239 |
| 6,799,246 B1 * | 9/2004 | Wise et al. | ................... | 711/117 |
| 6,970,013 B1 * | 11/2005 | Cory | ........................... | 326/38 |
| 6,990,620 B2 * | 1/2006 | Whetsel | ....................... | 714/735 |
| 2004/0027857 A1 * | 2/2004 | Ooishi | .................... | 365/185.11 |

FOREIGN PATENT DOCUMENTS

| | | |
|---|---|---|
| KR | 1020020032689 A | 5/2002 |
| KR | 10-2004-0052006 A | 6/2004 |

* cited by examiner

CIRCUITS AND METHODS FOR PROVIDING VARIABLE DATA I/O WIDTH FOR SEMICONDUCTOR MEMORY DEVICES

CROSS-REFERENCE TO RELATED APPLICATIONS

This application claims priority to Korean Patent Application No. 2003-66944, filed on Sep. 26, 2003, in the Korean Intellectual Property Office.

TECHNICAL FIELD OF THE INVENTION

The present invention relates generally to circuits and methods for controlling data I/O (input/output) operations for enabling variable I/O width semiconductor memory devices. More specifically, the present invention relates to circuits and methods for controlling data I/O operations in semiconductor memory devices to provide variable data I/O widths for read, write and active memory operations.

BACKGROUND

Conventional semiconductor IC (integrated circuit) memory devices are designed to operate at fixed data I/O widths. For example, in a processing system having an 8-bit data bus, 8-bit data words can be stored to, or retrieved from, a memory in a single memory access cycle (referred to as "X8 operation").

For example, FIG. 1A schematically illustrates a conventional semiconductor IC memory device (1) having a fixed I/O width. In general, the semiconductor IC memory device (1) comprises a first address input buffer (10), a row decoder (20), a column decoder (30), a second address input buffer (40), a command buffer (50), a memory cell array (60), a sense amplifier array (70), a data output buffer (80) and a data input buffer (90). The semiconductor IC memory device (1) further comprises eight data output pins (DOUT0~DOUT7) connected to the data output buffer (80) for outputting an 8-bit data word (Data_Out <0:7>) that is read from the memory (60), as well as eight data input pins (DIN0~DIN7) for inputting an 8-bit data word (Data_In <0:7>) that is to be written to the memory (60).

The first address input buffer (10) buffers a 9-bit external address signal (ADDR<0:8>) that is latched in from address lines, which can be either a column address signal or the first nine bits of a row address signal that is latched in with, e.g., a column address strobe (CAS) or a row address strobe (RAS), respectively. In the exemplary embodiment of FIG. 1, it is assumed that the row address bits (RA<0:8>) and column address bits (CA <0:8>) are multiplexed through the same address pins to minimize the number of pins required for interfacing with an address bus. The second address input buffer (40) buffers the last two bits (ADDR <9:10>) of the external row address signal. The row decoder (20) decodes the row address bits (RA <0:10>) received from the buffers (10) and (40) and generates a wordline signal (WL) to access a row of memory cells in the memory array (60) corresponding to the row address bits (RA<0:10>). The column decoder (30) decodes the column address bits (CA<0:8>) received from the buffer (10) to generate a column select signal (CSL) for accessing a block of memory locations within the accessed row, which in the exemplary embodiment of FIG. 1A, is a storage location corresponding to a group of 8 blocks.

Depending on whether a read or write operation is being performed as indicated by the input command (READ, WRITE) that is buffered by command buffer (50), an 8-bit data word (Data_Out<0:7>) is read from the accessed storage location, or an 8-bit data word (Data_In<0:7>) is written to the accessed storage location. The sense amplifier array (70) enables data to be read or written to the memory cell array (60).

The data output buffer (80) comprises a plurality of output buffers (81~88) for buffering a data word (Data_Out <0:7>) that is read from the memory cell array (60) during a read operation. The data input buffer (90) comprises a plurality of input buffers (91~98) that buffer a data word (Data_In <0:7>) to be written to the memory cell array (60) during a write operation. Each output buffer (81~88) is connected to a corresponding one of the data output pins (DOUT0~DOUT7) and each input buffer (91~98) is connected to a corresponding one of the data input pins (DIN0~DIN7) (although in another embodiment as depicted in FIG. 1B, a plurality of data I/O pins (DQ0~DQ7) are connected to corresponding ones of the output buffers (81~88) and the input buffers (91~98) and are used for both data input and data output).

As noted above, the conventional semiconductor IC memory device (1) provides a fixed X8 operation, i.e., an 8-bit data word is read from or written to the memory (60) during a single memory access operation. More specifically, FIG. 2 is an exemplary timing diagram illustrating a method for outputting data during a memory read operation of the semiconductor IC memory device (1). As illustrated in FIG. 2, a read command (READ) and a column address (CA) are input synchronously with a clock CLK signal at clock cycle C1 (it is assumed that a wordline has already been activated). In response, an 8-bit data word comprising bits Q0~Q7 are simultaneously output from the output buffer (80) to the respective output pins (DOUT0~DOUT7) about 2 clock cycles after the read command and column address are input.

Furthermore, FIG. 3 is an exemplary timing diagram illustrating a method for inputting data during a memory write operation of the semiconductor IC memory device (1). As illustrated in FIG. 3, a write command (WRITE) and a column address (CA) are input synchronously with a clock CLK signal at clock cycle C1 (it is assumed that a wordline has already been activated). In response, an 8-bit data word comprising bits D0~D7 are simultaneously input to the data input buffer (90) from the respective data input pins (DIN0~DIN7), in the same clock cycle C1 as the write command and the column address are input.

Conventional semiconductor memory devices such as described above, which employ fixed data I/O width control schemes can only perform read, write or active operations at the fixed I/O width. Such conventional semiconductor memory device designs are inefficient when used with systems or applications in which data words are not equal to, or multiples of, the fixed data I/O width. For instance, RGB (Red, Green Blue) data for notebook PC and mobile applications (cellular phones, PDA, etc) is represented by 18 bits (each component, R, G and B, comprises a 6-bit data word (X6)), whereas RGB data for desktop computers (PC) and servers is represented by 24 bits (each component, R, G and B, comprises an 8-bit data word (X8)). In such instance, if such notebook PC and mobile applications were used with a memory system having a fixed X8 operation, such applications would be processing 6 redundant data bits, i.e., at least 24 data bits would have to be accessed for an 18-bit data block. Such redundancy would result in unnecessary power consumption in such devices/applications due to processing of such redundant bits.

SUMMARY OF THE INVENTION

Exemplary embodiments of the invention include circuits and methods for controlling data I/O operations in semiconductor memory devices to provide variable data I/O widths for read, write and active memory operations. Exemplary embodiments of the invention further include circuits and methods for selectively controlling a data width of a data I/O buffer "on the fly" to enable variable data I/O widths during memory access operations.

In one exemplary embodiment of the invention, a semiconductor memory device comprises a memory cell array, a data buffer for processing data read from or written to the memory cell array, and a data width control circuit for selectively controlling a data width of the data buffer in response to an external address signal.

In another exemplary embodiment of the invention, the data width control circuit comprises a decoder for decoding the external address signal in response to a data access command to generate a first control signal, and a data buffer controller that is responsive to the first control signal to generate a second control signal for controlling the data width of the data buffer. In another exemplary embodiment, the data width control circuit selectively controls the data width of the data buffer by generating a control signal that masks or unmasks one or more bits of the data buffer, wherein a masked bit is prevented from being input to the memory cell array from the data buffer or wherein a masked bit is prevented from being output from the data buffer.

In yet another exemplary embodiment of the invention, a semiconductor memory device comprises a memory cell array, a data output buffer for outputting data read from the memory cell array, a data input data buffer for inputting data to be written to the memory cell array, and a data width control circuit for selectively controlling a data width of the data output buffer or the data input buffer in response to an external address signal. In one exemplary embodiment, the data width control circuit comprises a decoder which is activated in response to a read command signal or write command signal to decode the external address to generate a first control signal, a data input buffer controller which is activated in response to the write command signal to generate a second control signal for controlling the data width of the data input buffer based on the first control signal, and a data output buffer controller which is activated in response to the read command signal to generate a second control signal for controlling the data width of the data output buffer based on the first control signal. The data width control circuit selectively controls the data width of the data input buffer or data output buffer by generating a control signal that masks or unmasks one or more bits of the data buffer.

These and other exemplary embodiments, objects, aspects, features and advantages of the present invention will be described and become apparent from the following detailed description of preferred embodiments, which is to be read in connection with the accompanying drawings.

DETAILED DESCRIPTION OF THE EXEMPLARY EMBODIMENTS

Exemplary embodiments of the invention include circuits and methods for controlling data I/O operations in semiconductor memory devices to provide variable data I/O widths for read, write and active memory operations. Exemplary embodiments of the invention further include circuits and methods for selectively controlling a data width of a data I/O buffer "on the fly" to enable variable data I/O widths during memory access operations.

Figure 1A:
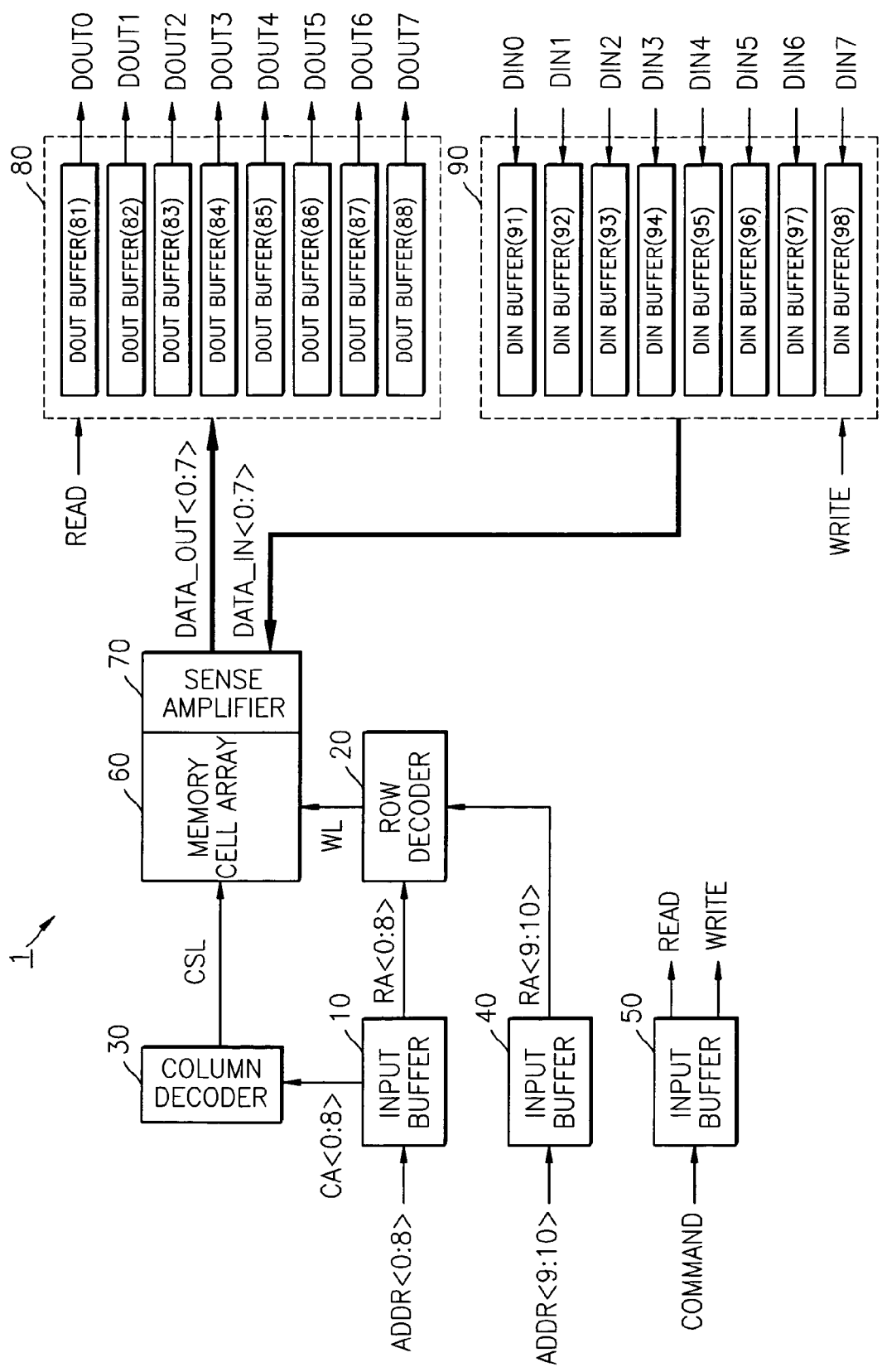
FIGS. 1A and 1B are diagrams that schematically illustrate conventional architectures for semiconductor IC memory devices.
Figure 4:
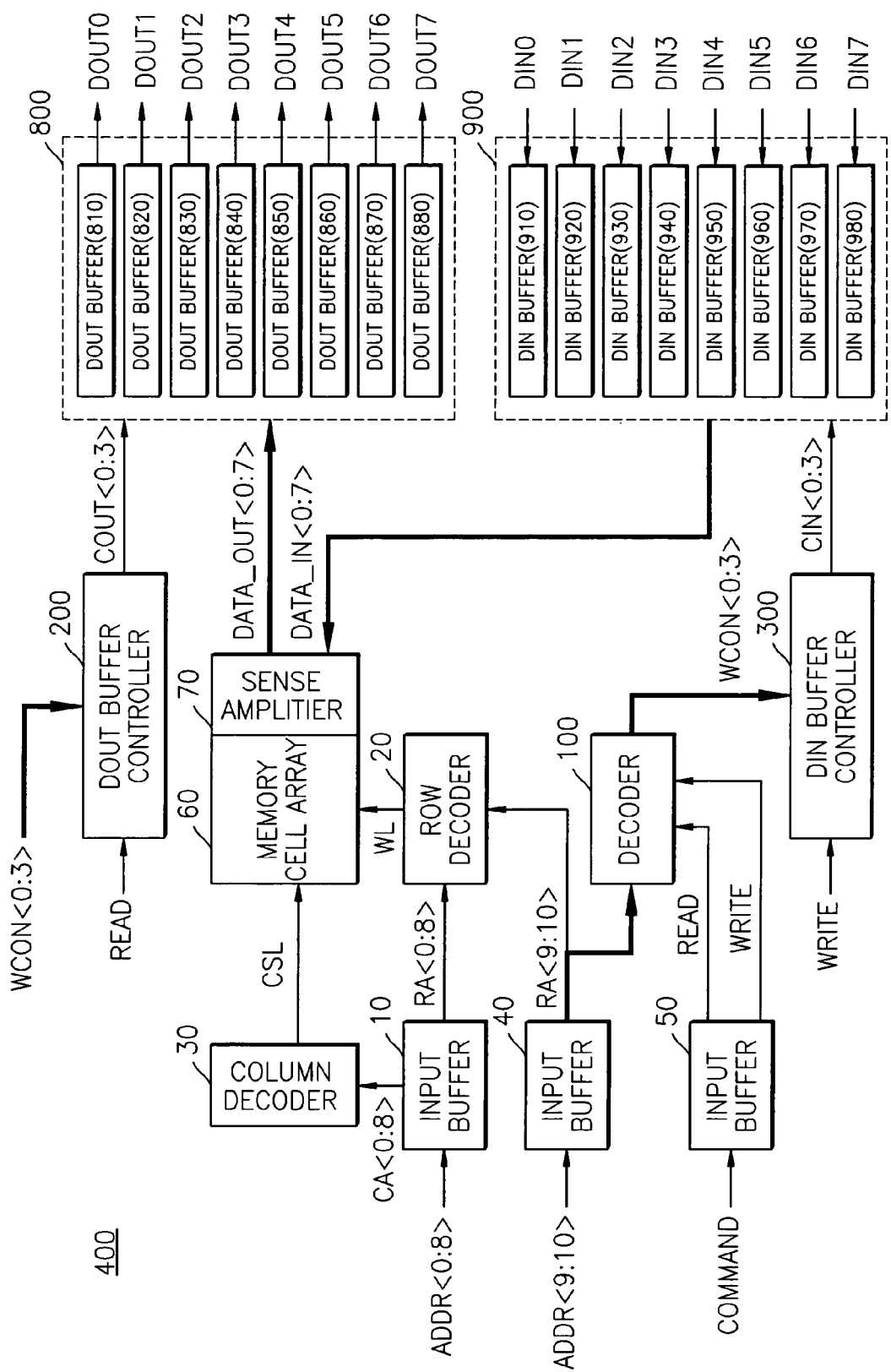
FIG. 4 is a diagram that schematically illustrates a semiconductor IC memory device having a variable I/O width for read, write or active operations, according to an exemplary embodiment of the present.

Referring now to FIG. 4, a block diagram schematically illustrates a semiconductor IC memory device (400) providing variable I/O width control for read, write or active operations, according to an exemplary embodiment of the present invention. The exemplary semiconductor IC memory device (400) comprises a first address input buffer (10), a row decoder (20), a column decoder (30), a second address input buffer (40), a command buffer (50), a memory cell array (60), and a sense amplifier array (70), which essentially operate, for example, in the same manner as discussed above with reference to FIG. 1A.

Figure 1B:
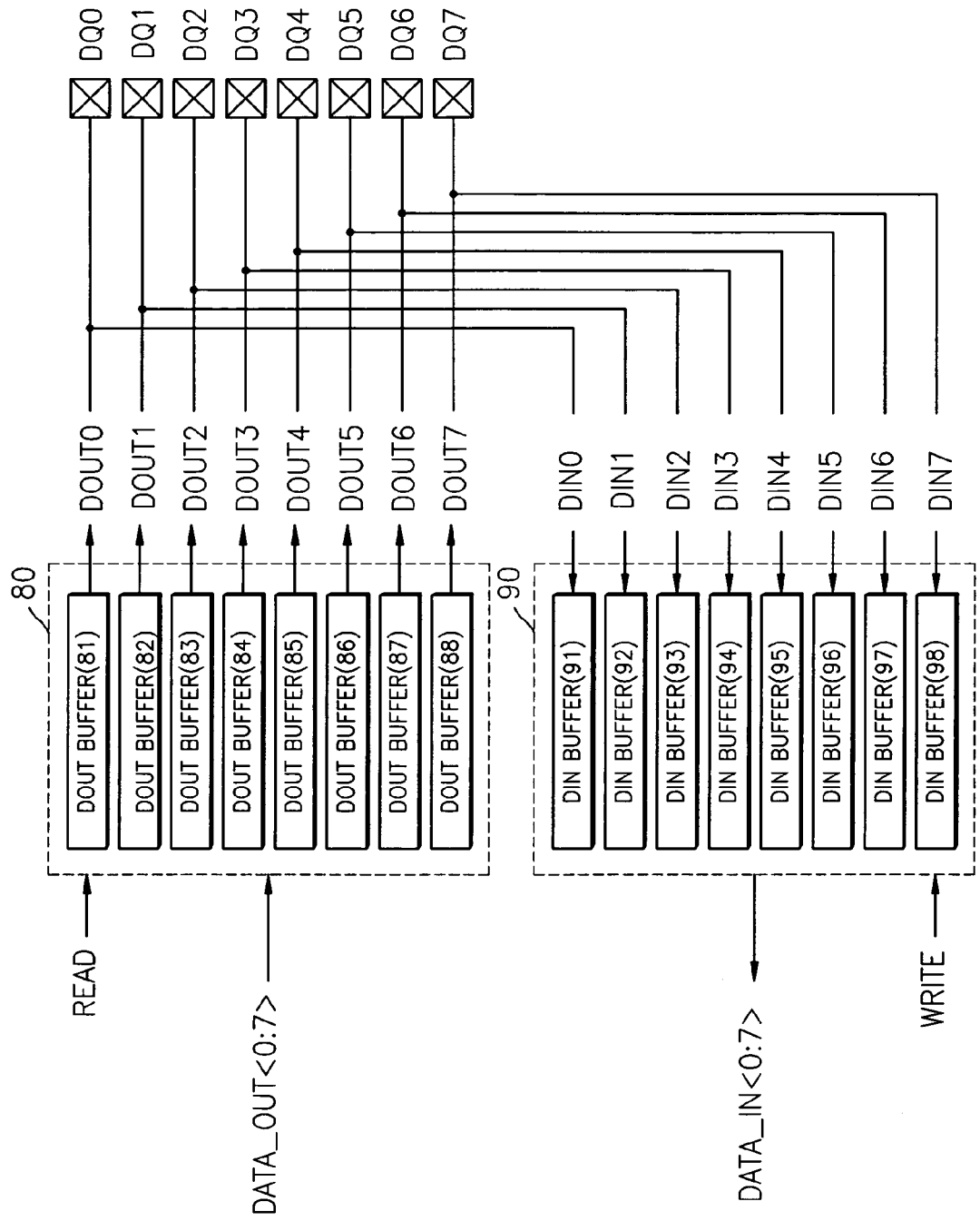
Figure 2:
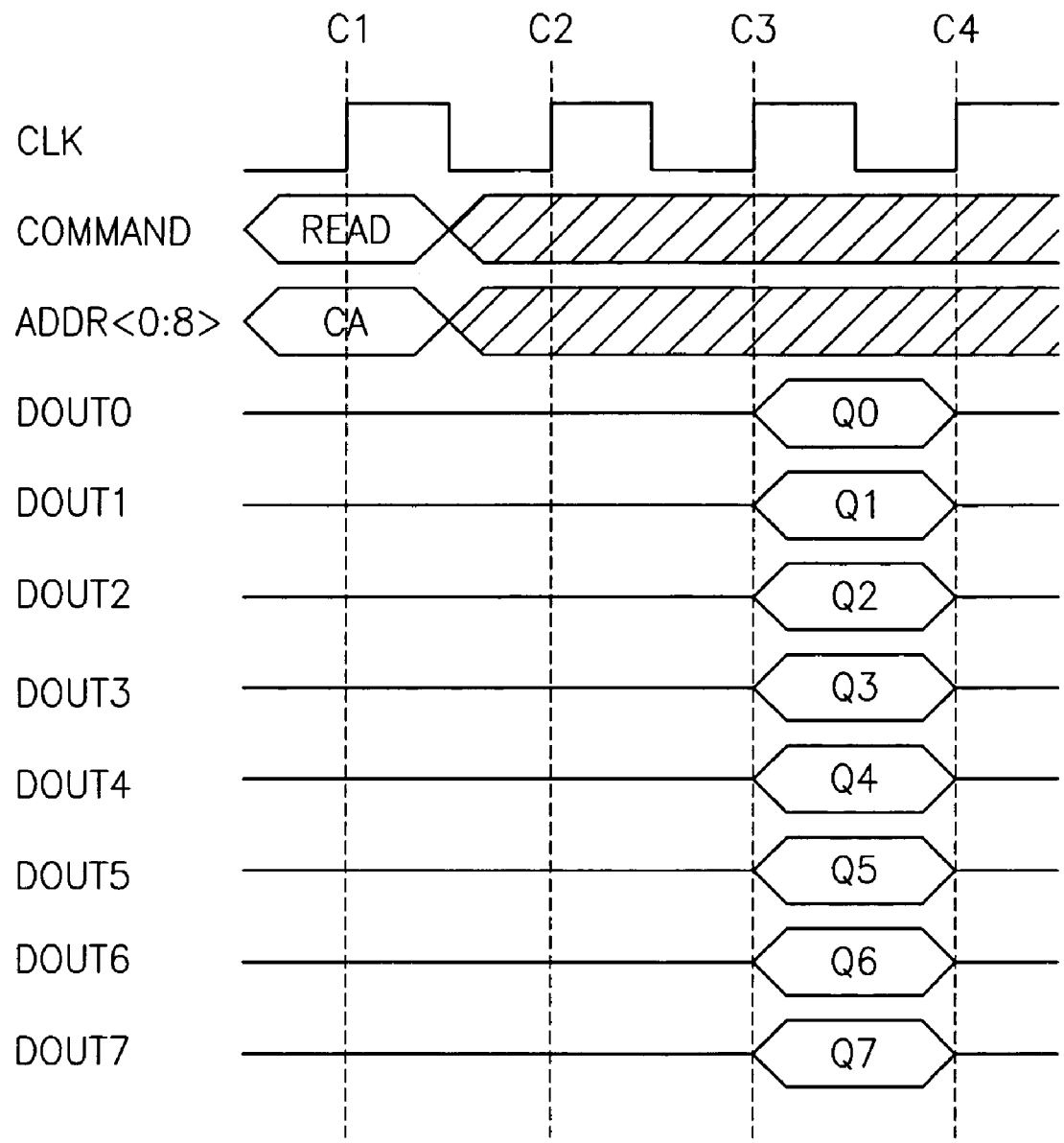
FIG. 2 is a timing diagram illustrating a conventional method for outputting data during a memory read operation of a semiconductor IC memory device having a fixed I/O width.
Figure 3:
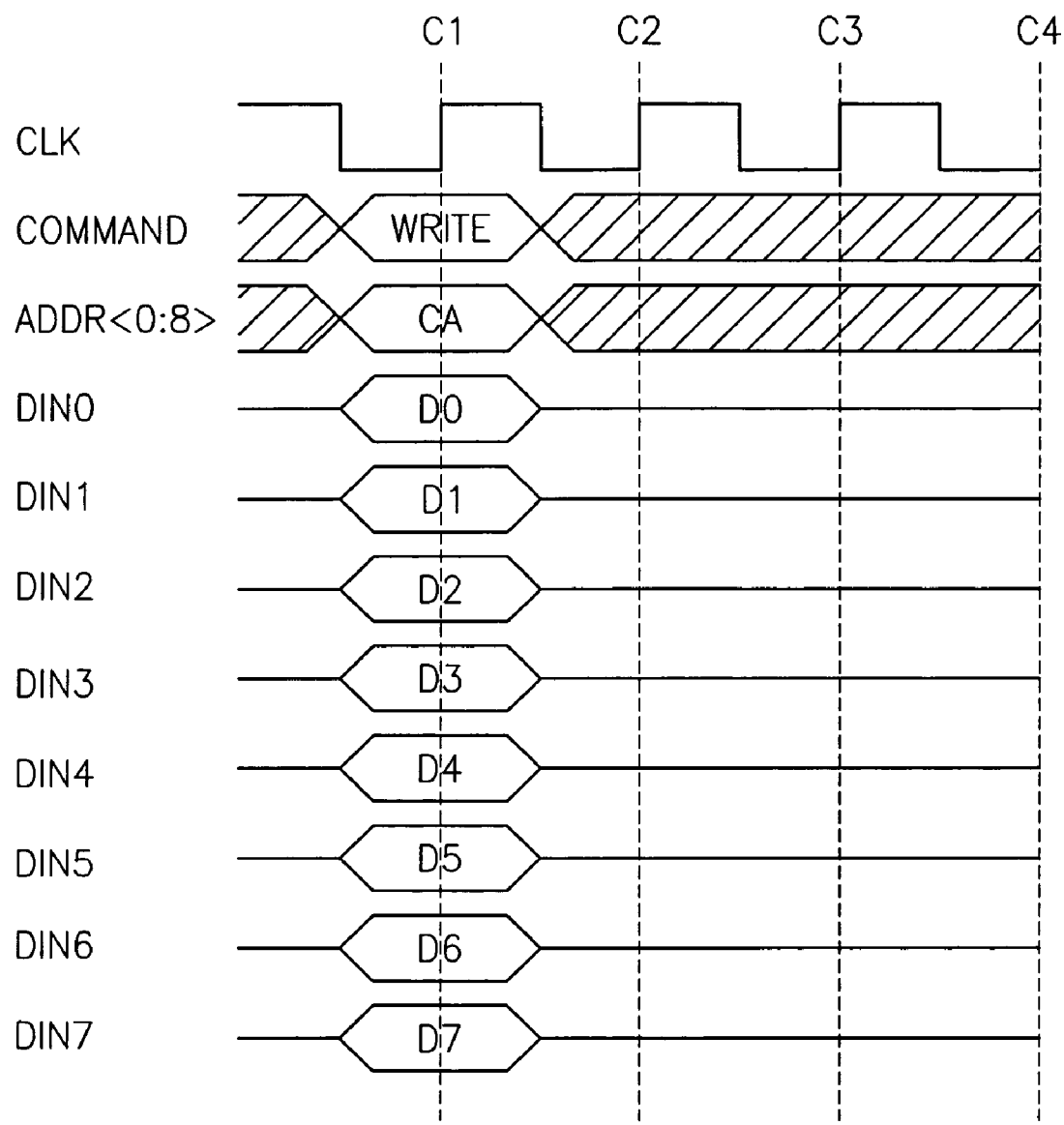
FIG. 3 is a timing diagram illustrating a conventional method for inputting data during a memory write operation of a semiconductor IC memory device having a fixed I/O width.

The semiconductor IC memory device (400) further comprises circuitry for enabling variable I/O width control. More specifically, in one exemplary embodiment, the semiconductor IC memory device (400) comprises a decoder (100), a data output (DOUT) buffer controller (200) for controlling a data output buffer (800), and a data input (DIN) buffer controller (300) for controlling a data input buffer (900). The data output buffer (800) comprises a plurality of output buffers (810~880) connected to respective output pins (DOUT0~DOUT7). The data input buffer (900) comprises a plurality of input buffers (910~980) connected to respective input pins (DIN0~DIN7), although it is to be understood that the data output buffer (800) and data input buffer (900) can be commonly connected to data I/O pins (such as illustrated in FIG. 1B).

In general, in one exemplary embodiment of the invention, the semiconductor IC memory device (400) provides variable I/O width control for a single memory access operation by controlling the data output buffer (800) to mask either none, or a plurality of data bits of a data word (Data_Out<0:7>) which is read from the memory (60), or by controlling the data input buffer (900) to mask either none or a plurality of data bits of a data word (Data_In<0:7>) which is to be written to memory.

More specifically, the decoder (100) is activated in response to a READ or WRITE command received from the command buffer (50) and decodes an external I/O width control signal to generate an internal I/O width control signal (e.g., WCON<0:3>). In the exemplary embodiment of FIG. 4, the external I/O width control signal comprises a 2-bit signal (AD<9:10>) that is input via the address bit lines (ADDR<9:10>) to the input buffer (40). All of the address signals AD<0:10> are used for activating a word line signal (WL). The 2-bit signal AD<9:10> accompanied with the read or write command are not used (i.e., redundant) during read or write operations. During a READ operation, the DOUT buffer controller (200) is responsive to the internal I/O width control signal (WCON<0:3>) output from the decoder (100) to generate an output buffer control signal (COUT<0:3>), which controls the output width of the data output buffer (800). Similarly, during a WRITE operation, the DIN buffer controller (300) is responsive to the internal I/O width control signal (WCON<0:3>) output from the decoder (100) to generate an input buffer control signal (CIN<0:3>), which controls the input width of the data input buffer (900).

In the exemplary embodiment of FIG. 4, it is assumed that the memory device (400) is implemented in a system having an 8-bit wide data I/O bus. In such exemplary embodiment, as explained below, the semiconductor IC memory device (400) can be dynamically configured in response to the external 2-bit I/O width control signal (AD<9:10>) to provide one of X2, X4, X6 or X8 operation.

Figure 5:
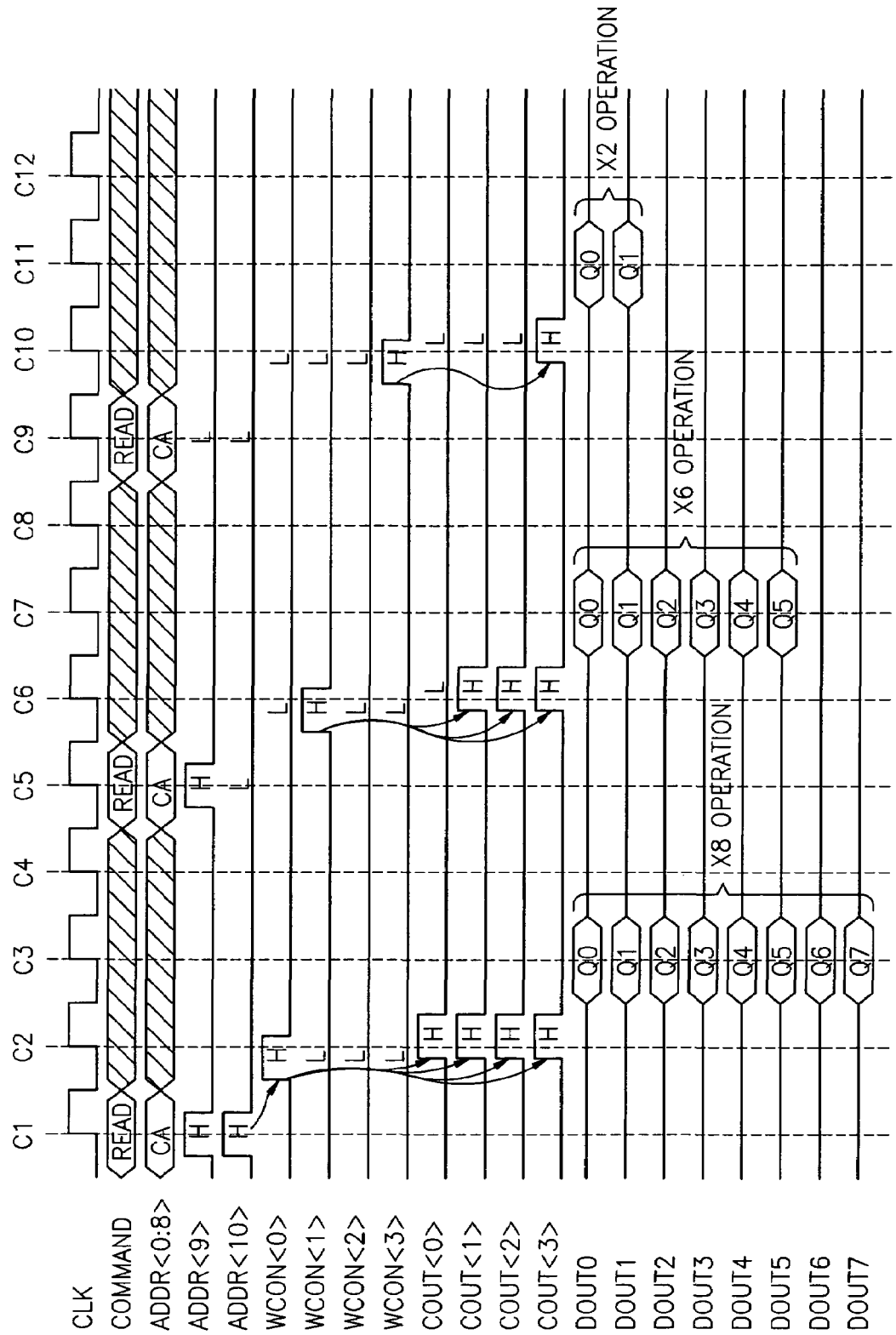
FIG. 5 is an exemplary timing diagram that illustrates a method for variably controlling data output width for a memory read operation according to an exemplary embodiment of the present invention.

FIG. 5 is an exemplary timing diagram that illustrates a method for variably controlling the data output width for a memory read operation, according to an exemplary embodiment of the present invention. More specifically, FIG. 5 illustrates operational modes of the exemplary semiconductor memory device (400) for dynamically controlling the data output width to provide X8, X6 or X2 operation for memory read operations. As shown in FIG. 5, READ command and column addresses CA are synchronously input at the beginning of clock cycles C1, C5 and C9 for reading data from memory. It is assumed in FIG. 5 that for each read operation, a row RA address has been input and a wordline has been activated.

For an X8 memory read operation, external I/O width control bits of logic level "11" are input from address lines (ADDR<9>) and (ADDR<10>) synchronously with READ and CA at the beginning of C1. In response, the decoder (100) outputs a 4-bit internal I/O width control signal (WCON<0:3>) of logic "1000", which is input to the DOUT buffer controller (200). In response, the DOUT buffer controller (200) outputs a 4-bit output buffer control signal (COUT<0:3>) of logic "1111". The DOUT buffer (800) is responsive to the output buffer control signal (COUT<0:3>) of logic "1111" to output an 8-bit data word (Q0~Q7), without masking any data bits read from the memory.

For an X6 memory read operation, external I/O width control bits of logic level "10" are input from address lines (ADDR<9>) and (ADDR<10>) synchronously with the READ and CA at the beginning of C5. In response, the decoder (100) outputs a 4-bit internal I/O width control signal (WCON<0:3>) of logic "0100", which is input to the DOUT buffer controller (200). In response, the DOUT buffer controller (200) outputs a 4-bit output buffer control signal (COUT<0:3>) of logic "0111". The DOUT buffer (800) is responsive to the output buffer control signal (COUT<0:3>) of logic "0111" to output a 6-bit data word (Q0~Q5) by masking the last two bits (Data_Out<6:7>) of the data word read from the memory.

As further illustrated in FIG. 5, for an X2 memory read operation, external I/O width control bits of logic level "00" are input from address lines (ADDR<9>) and (ADDR<10>) synchronously with the READ and CA at the beginning of C9. In response, the decoder (100) outputs a 4-bit internal I/O width control signal (WCON<0:3>) of logic "0001", which is input to the DOUT buffer controller (200). In response, the DOUT buffer controller (200) outputs a 4-bit output buffer control signal (COUT<0:3>) of logic "0001". The DOUT buffer (800) is responsive to the output buffer control signal (COUT<0:3>) of logic "0001" to output a 2-bit data word (Q0~Q1) by masking the last six bits (Data_Out <2:7>) of the data word read from the memory.

Figure 6:
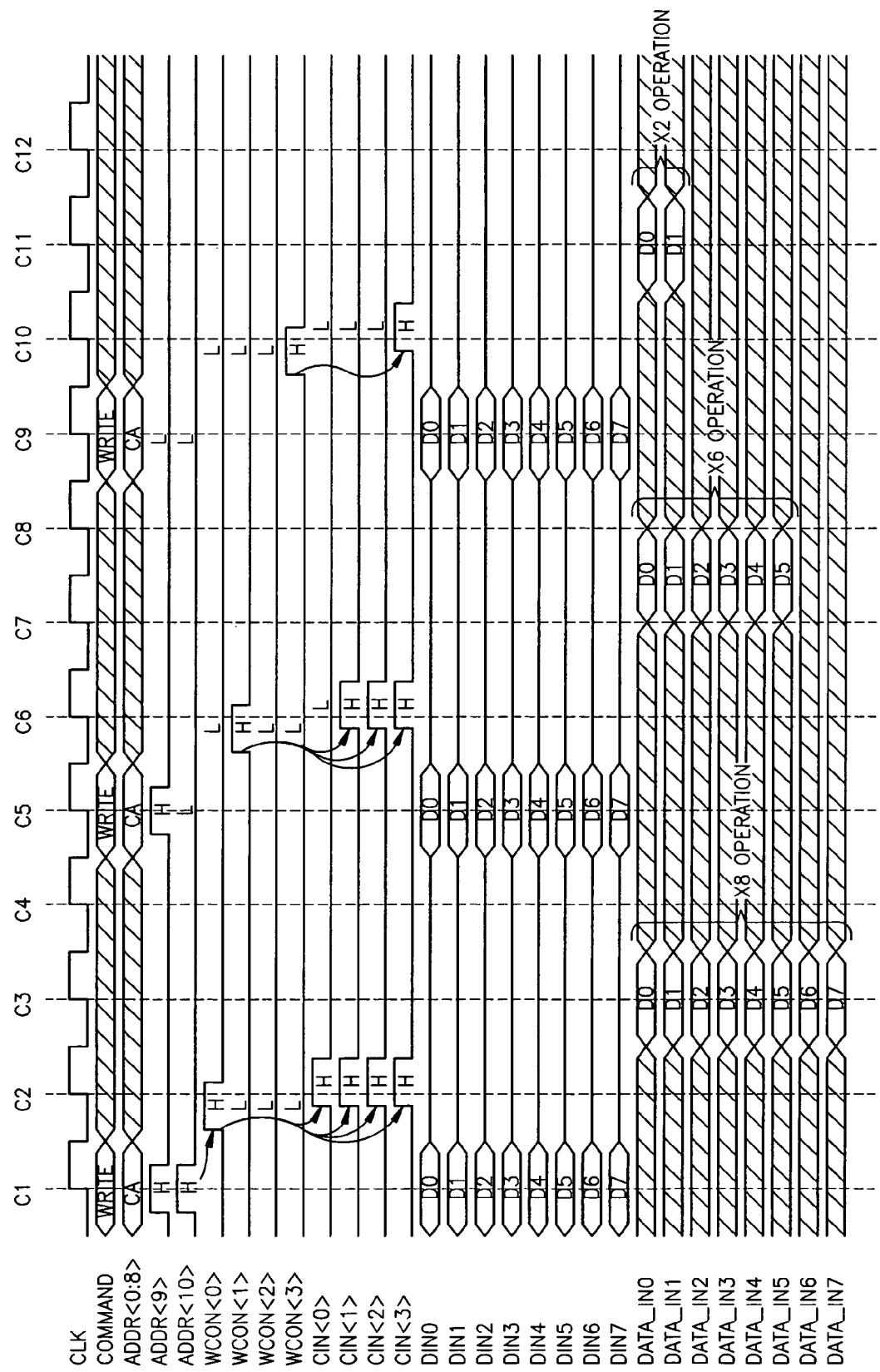
FIG. 6 is an exemplary timing diagram that illustrates a method for variably controlling data input width for a memory write operation according to an exemplary embodiment of the present invention.

FIG. 6 is an exemplary timing diagram that illustrates a method for variably controlling the data input width for a memory write operation, according to an exemplary embodiment of the present invention. More specifically, FIG. 6 illustrates operational modes of the exemplary semiconductor memory device (400) for dynamically controlling the data input width to provide X8, X6 or X2 operation for memory write operations. As shown in FIG. 6, WRITE commands and column addresses CA are synchronously input at the beginning of clock cycles C1, C5 and C9 for writing data to memory. In addition, for each write operation, an 8-bit data word (D0~D7) is input in the data input buffer (900) synchronously with the WRITE and CA at the beginning of C1, C5 and C9. It is assumed in FIG. 6 that for each write operation, a row RA address has been input and a wordline has been activated.

For an X8 memory write operation, external I/O width control bits of logic level "11" are input from address lines (ADDR<9>) and (ADDR<10>) synchronously with the WRITE and CA at the beginning of C1. In response, the decoder (100) outputs a 4-bit internal I/O width control signal (WCON<0:3>) of logic "1000", which is input to the DIN buffer controller (300). In response, the DIN buffer controller (300) outputs a 4-bit input buffer control signal (CIN<0:3>) of logic "1111". The DIN buffer (900) is responsive to the input buffer control signal (CIN<0:3>) of logic "1111" to output an 8-bit data word (DI0~DI7) to be written to memory, i.e., without masking any of the data input bits (D0~D7) to provide an 8-bit data word (Data_In<0:7>) to be written to the memory.

For an X6 memory write operation, external I/O width control bits of logic level "10" are input from address lines (ADDR<9>) and (ADDR<10>) synchronously with the WRITE and CA at the beginning of C5. In response, the decoder (100) outputs a 4-bit internal I/O width control signal (WCON<0:3>) of logic "0100", which is input to the DIN buffer controller (300). In response, the DIN buffer controller (300) outputs a 4-bit input buffer control signal (CIN<0:3>) of logic "0111". The DIN buffer (900) is responsive to the input buffer control signal (CIN<0:3>) of logic "0111" to output a 6-bit data word (DI0~DI5), i.e., masking the last two data bits of the input data (D0~D7) to generate a 6-bit data word (Data_In<0:5>) to be written to the memory.

As further illustrated in FIG. 6, for a X2 memory write operation, external I/O width control bits of logic level "00" are input from address lines (ADDR<9>) and (ADDR<10>) synchronously with the WRITE and CA at the beginning of C9. In response, the decoder (100) outputs a 4-bit internal I/O width control signal (WCON<0:3>) of logic "0001", which is input to the DIN buffer controller (300). In response, the DIN buffer controller (300) outputs a 4-bit input buffer control signal (CIN<0:3>) of logic "0001". The DIN buffer (900) is responsive to the input buffer control signal (CIN<0:3>) of logic "0001" to output a 2-bit data word (DI0~DI1), i.e., masking the last six data bits of the input data (D0~D7) to generate a 2-bit data word (Data_In<0:1>) to be written to the memory.

Figure 7:
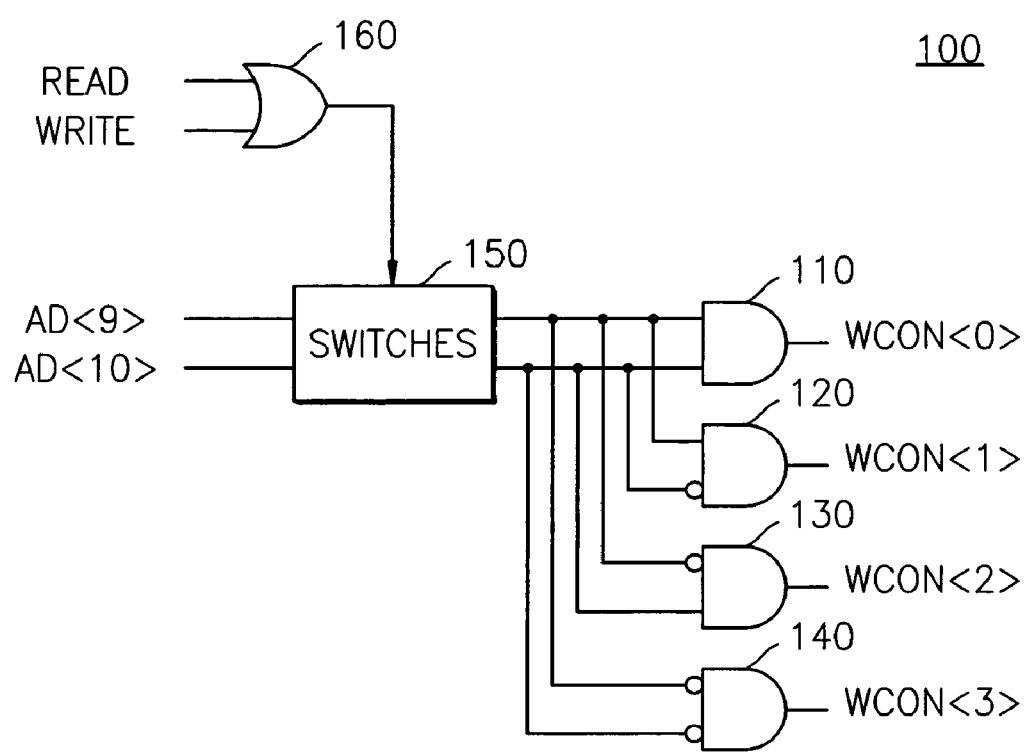
FIG. 7 is a circuit diagram illustrating a decoder according to an exemplary embodiment of the present invention, which can be implemented in the exemplary semiconductor IC memory device of FIG. 4.

FIG. 7 is a circuit diagram illustrating a decoder (100) according to an exemplary embodiment of the present invention, which can be implemented in the exemplary semiconductor IC memory device (400) of FIG. 4. In general, the exemplary decoder (100) comprises a plurality of logic circuits (110, 120, 130, 140) that are connected in parallel to the output of a switching circuit (150). The switching circuit (150) receives an external I/O width control signal (e.g., the 2-bit control signal input AD<9:10> input on the redundant address lines). The decoder (100) further comprises an OR logic gate (160) that receives as input a READ or WRITE command during a memory access operation. The switching circuit (150) is activated in response to either a READ or WRITE signal. Based on the logic level of control bits AD<9:10> of the external I/O width control signal, one of the bits of the internal I/O width control signal (WCON<0:3>) will be logic "1" during a read or write operation. The following Table 1 illustrates the logic level of the buffer control signal (WCON<0:3>) that is generated during a READ or WRITE operation based on the logic level of the control bits of the external I/O width control signal (AD<9:10>) for different I/O widths.

TABLE 1

| I/O Width | AD <9> | AD <10> | WCON <0> | WCON <1> | WCON <2> | WCON <3> |
|---|---|---|---|---|---|---|
| X8 | 1 | 1 | 1 | 0 | 0 | 0 |
| X6 | 1 | 0 | 0 | 1 | 0 | 0 |
| X4 | 0 | 1 | 0 | 0 | 1 | 0 |
| X2 | 0 | 0 | 0 | 0 | 0 | 1 |

Figure 8:
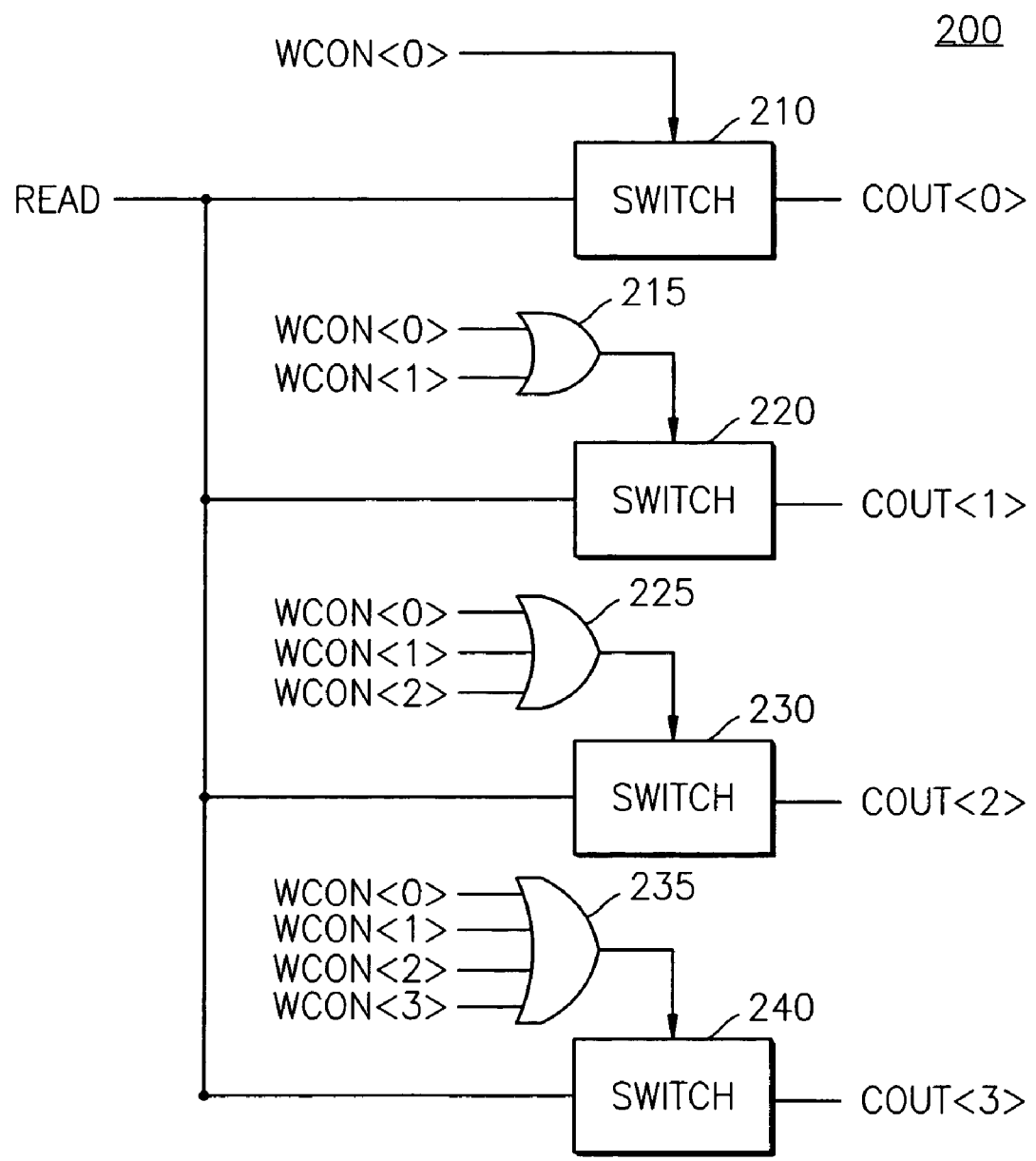
FIG. 8 is a circuit diagram illustrating a data output buffer controller according to an exemplary embodiment of the present invention, which can be implemented in the exemplary semiconductor IC memory device of FIG. 4.

FIG. 8 is a circuit diagram illustrating a data output buffer controller (200) according to an exemplary embodiment of the present invention, which can be implemented in the exemplary semiconductor IC memory device (400) of FIG. 4. In general, the exemplary DOUT buffer controller (200) comprises a plurality of switches (210, 220, 230, 240) and a plurality of OR gates (215, 225, 235). The DOUT buffer controller (200) is activated in response to a READ command signal. In particular, each switch (210, 220, 230 and 240) receives as input a READ command signal and outputs a respective output buffer control bit (COUT<0>, COUT<1>, COUT<2>, COUT<3>) depending on the logic level of the internal I/O width control signal (WCON<0:3>) output from the decoder (100). The following Table 2 illustrates the logic level of the output buffer control signal (COUT<0:3>) that is generated during a READ operation based on the logic level of the internal I/O width control signal (WCON<0:3>) for different I/O widths.

TABLE 2

| I/O Width | WCON <0> | WCON <1> | WCON <2> | WCON <3> | COUT <0> | COUT <1> | COUT <2> | COUT <3> |
|---|---|---|---|---|---|---|---|---|
| X8 | 1 | 0 | 0 | 0 | 1 | 1 | 1 | 1 |
| X6 | 0 | 1 | 0 | 0 | 0 | 1 | 1 | 1 |
| X4 | 0 | 0 | 1 | 0 | 0 | 0 | 1 | 1 |
| X2 | 0 | 0 | 0 | 1 | 0 | 0 | 0 | 1 |

Figure 9:
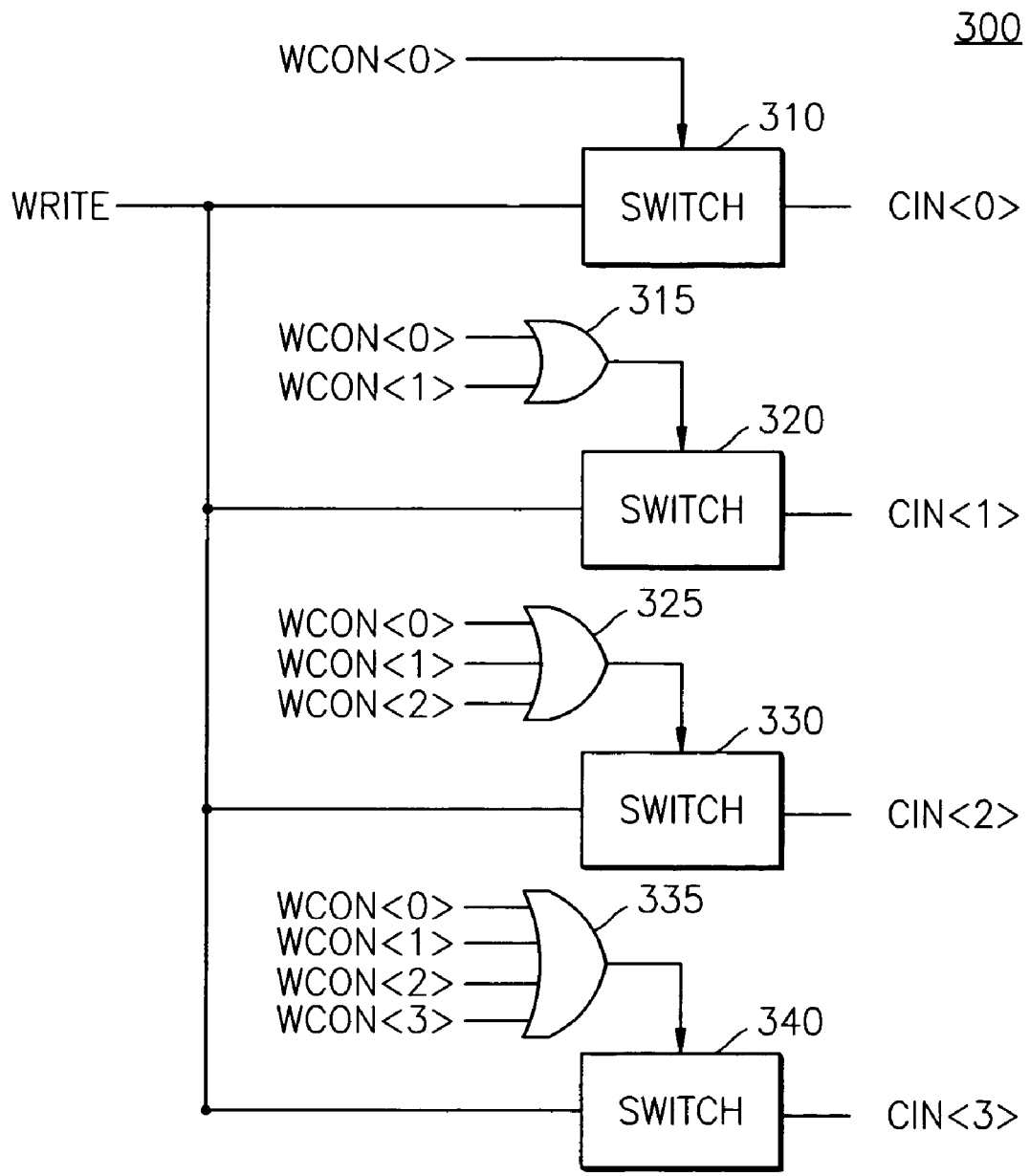
FIG. 9 is a circuit diagram that illustrates a data input buffer controller according to an exemplary embodiment of the present invention, which can be implemented in the exemplary semiconductor IC memory device of FIG. 4.

FIG. 9 is a circuit diagram illustrating a data input buffer controller (300) according to an exemplary embodiment of the present invention, which can be implemented in the exemplary semiconductor IC memory device (400) of FIG. 4. In general, the exemplary DIN buffer controller (300) comprises a plurality of switches (310, 320, 330, 340) and a plurality of OR gates (315, 325, 335). The DIN buffer controller (300) is activated in response to a WRITE command signal. In particular, each switch (310, 320, 330 and 340) receives as input a WRITE command signal and outputs a respective input buffer control bit (CIN<0>, CIN<1>, CIN<2>, CIN<3>) depending on the logic level of the internal I/O width control signal (WCON<0:3>) output from the decoder (100). The following Table 3 illustrates the logic level of the input buffer control signal (CIN<0:3>) that is generated during a WRITE operation based on the logic level of the internal I/O width control signal (WCON<0:3>) for different I/O widths.

TABLE 3

| I/O Width | WCON <0> | WCON <1> | WCON <2> | WCON <3> | CIN <0> | CIN <1> | CIN <2> | CIN <3> |
|---|---|---|---|---|---|---|---|---|
| X8 | 1 | 0 | 0 | 0 | 1 | 1 | 1 | 1 |
| X6 | 0 | 1 | 0 | 0 | 0 | 1 | 1 | 1 |
| X4 | 0 | 0 | 1 | 0 | 0 | 0 | 1 | 1 |
| X2 | 0 | 0 | 0 | 1 | 0 | 0 | 0 | 1 |

Figure 10:
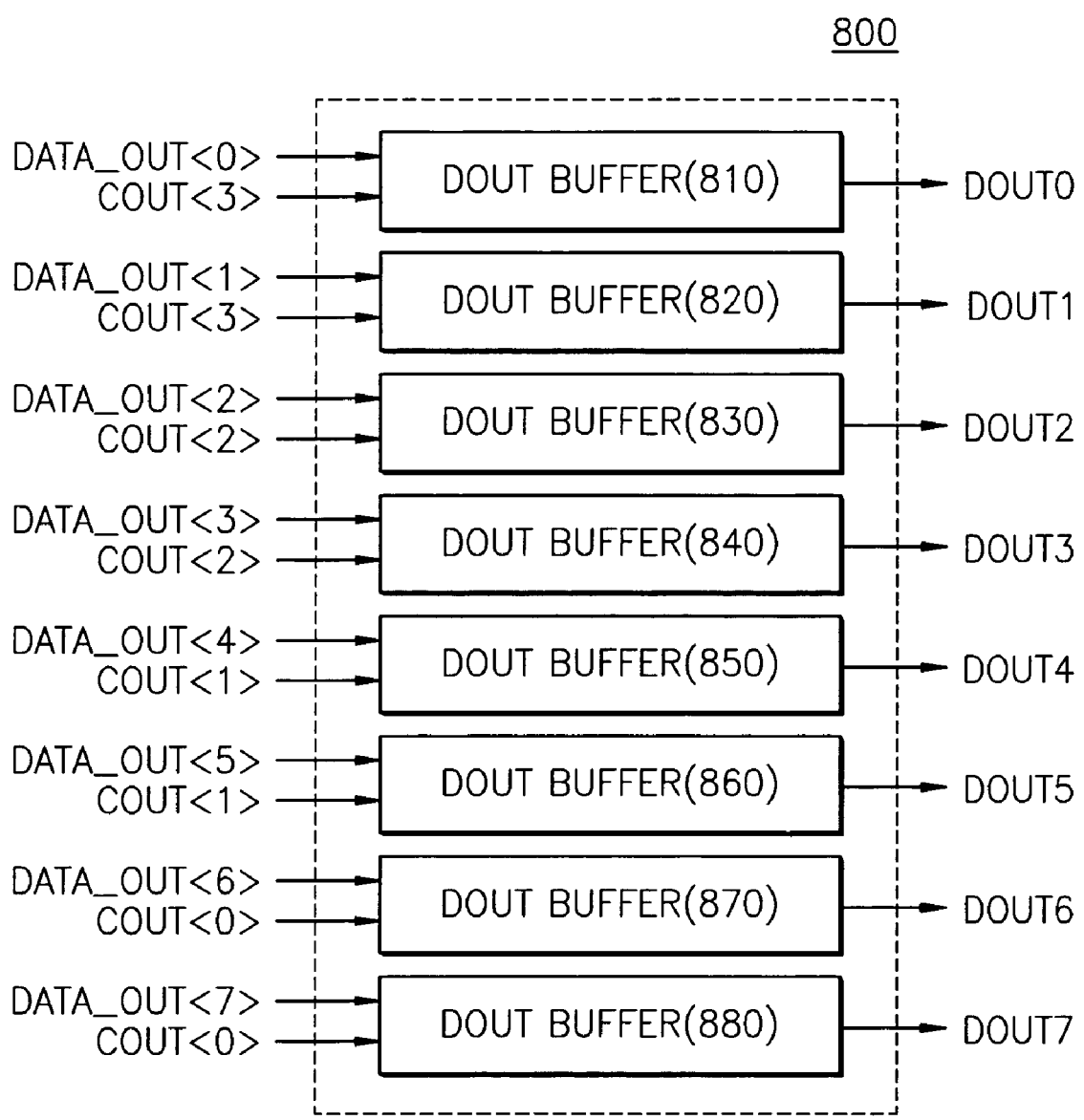
FIG. 10 illustrates a data output buffer according to an exemplary embodiment of the invention, which can be implemented in the semiconductor IC memory device of FIG. 4.

FIG. 10 illustrates a data output buffer (800) according to an exemplary embodiment of the invention, which can be implemented in the semiconductor IC memory device (400) of FIG. 4. In particular, FIG. 10 illustrates the inputs and outputs of each of the DOUT buffers (810~880) of the data output buffer (800) of FIG. 4, according to an exemplary embodiment of the invention. The DOUT buffers (810~880) receive respective data bits (Data_Out<0>~Data_Out<7>), which are read from memory, as well as control bits of the output buffer control signal (COUT<0:3>). In particular, in the exemplary embodiment of FIG. 10, the DOUT buffers (810) and (820) receive as input the COUT<3> control bit, the DOUT buffers (830) and (840) receive as input the COUT<2> control bit, the DOUT buffers (850) and (860) receive as input the COUT<1> control bit, and the DOUT buffers (870) and (880) receive as input the COUT<0> control bit. Depending on the logic level of the control bit COUT<i> input to the DOUT buffers (810~880), the DOUT buffers (810~880) may operate to mask some of the data bits of the read data word (Data_Out<0:7>) and prevent such bits from being output to data output pins (DOUT0~DOUT7).

Figure 11:
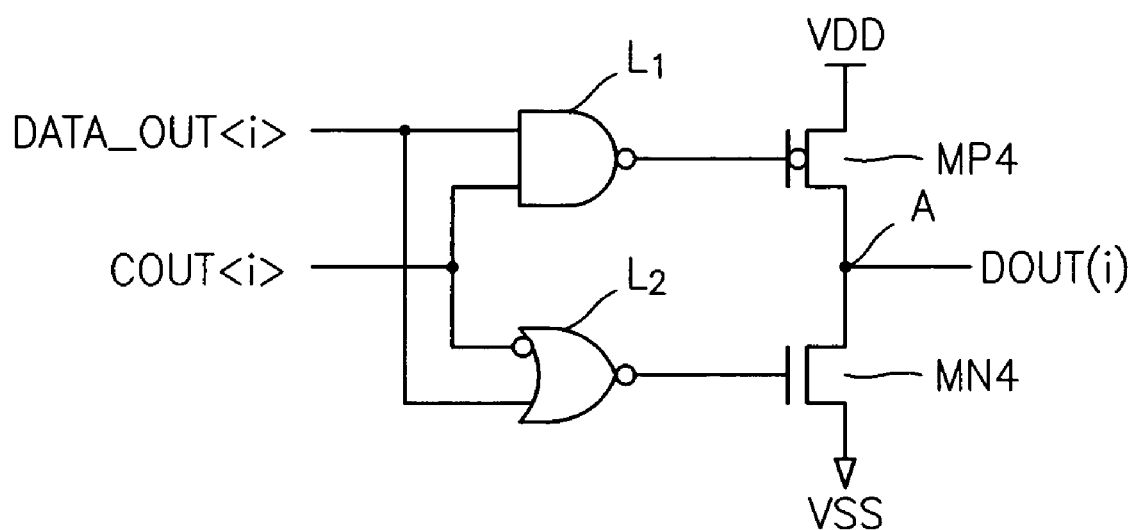
FIG. 11 is a circuit diagram that illustrates a buffer according to an exemplary embodiment of the invention, which can be implemented in the data output buffer of FIG. 10.

More specifically, by way of example with reference to FIG. 11, a circuit diagram illustrates a DOUT buffer according to an exemplary embodiment of the invention. The exemplary circuit architecture illustrated in FIG. 11 can be implemented for each of the DOUT buffers (810~880) illustrated in FIG. 10. The exemplary DOUT buffer comprises a first logic circuit (L1), a second logic circuit (L2) and an inverter comprising a PMOS transistor (MP4) and an NMOS transistor (MN4). In operation, when the control bit (COUT<i>) has a logic level "1", the logic level of the output data bit (DOUT (i)) will be equal to the logic level of the data bit (Data_Out<i>) read from memory. For instance, assuming Data_Out<i> and COUT<i> are both at logic level "1", the output of L1 would be logic "0" and the output of L2 would be logic "0". As such, the NMOS transistor (MN4) would be turned "off" and the PMOS transistor (MP4) would be turned "On", thereby pulling the output node (A) up to logic level "1".

On the other hand, when COUT<i> is logic "0", the output of L1 will be logic "1" and the output of L2 will be logic "0", regardless of the logic level of the data bit Data_Out<i>. In such case, both transistors (MP4) and (MN4) will be turned "off", thereby "masking" the data from being output to DOUT(i). Again, in one exemplary embodiment of the invention, each of the DOUT buffers (810~880) of FIG. 10 have the same circuit architecture as depicted in FIG. 11 and operate in the same manner.

Figure 12:
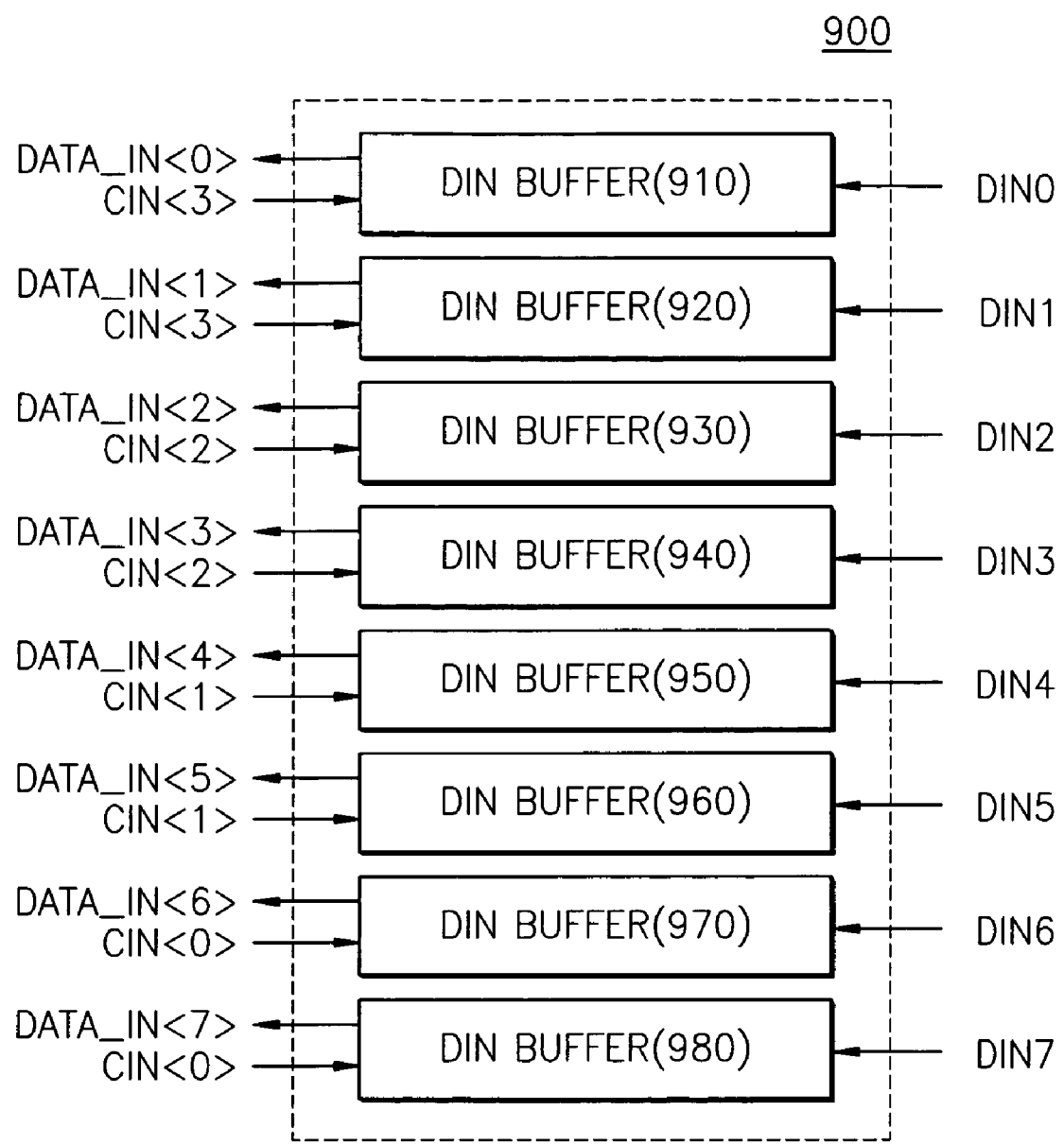
FIG. 12 illustrates a data input buffer according to an exemplary embodiment of the invention, which may be implemented in the semiconductor IC memory device of FIG. 4.

FIG. 12 illustrates a data input buffer (900) according to an exemplary embodiment of the invention, which may be implemented in the semiconductor IC memory device (400) of FIG. 4. In particular, FIG. 12 illustrates inputs and outputs of each of the DIN buffers (910~980) of the data input buffer (900) of FIG. 4, according to an exemplary embodiment of the invention. The DIN buffers (910~980) receive respective input data bits (DIN0~DIN7) that are to be written to memory, as well as control bits CIN<i> of the input buffer control signal (CIN<0:3>). In particular, in the 20 exemplary embodiment of FIG. 12, the DIN buffers (910) and (920) receive as input the CIN<3> control bit, the DIN buffers (930) and (940) receive as input the CIN<2> control bit, the DIN buffers (950) and (960) receive as input the CIN<1> control bit, and the DIN buffers (970) and (980) receive as input the CIN<0> control bit. Depending on the logic level of the control bits CIN<i> input to the DIN buffers (910~980), the DIN buffers (910~980) may operate to mask some of the input data bits (DIN0~DIN7).

Figure 13:
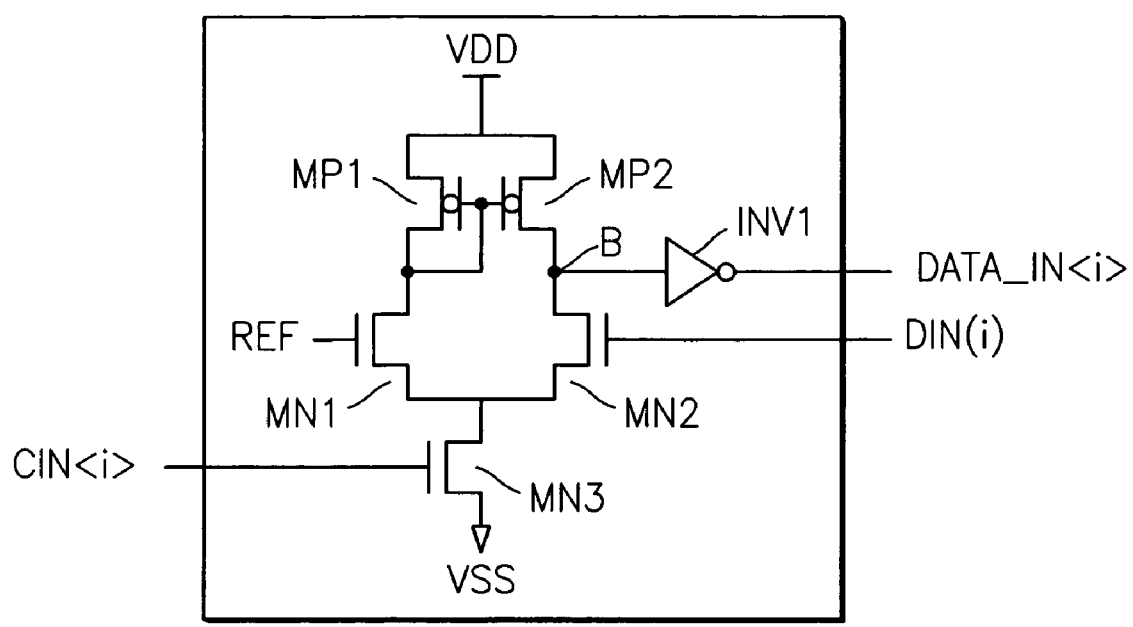
FIG. 13 is a circuit diagram that illustrates a buffer according to an exemplary embodiment of the invention, which can be implemented in the data input buffer of FIG. 12.

More specifically, by way of example with reference to FIG. 13, a circuit diagram illustrates a DIN buffer according to an exemplary embodiment of the invention. The exemplary circuit architecture illustrated in FIG. 13 can be implemented for each of the DIN buffers (910~980) illustrated in FIG. 12. In general, the exemplary circuit architecture of the DIN buffer in FIG. 13 comprises differential amplifier type input buffer including an NMOS transistor (MN2) for receiving input data (DIN(i)), an NMOS transistor (MN1) for receiving a reference voltage (REF), a current mirror formed by PMOS transistors (MP1) and (MP2), an NMOS transistor (MN3) that receives as input a control bit (CIN<i>) for controlling the NMOS transistor (MN3) to connect/disconnect the differential amplifier to/from ground voltage (VSS), and an inverter (INV1) for inverting data from a node (B) and for outputting a data bit (Data_In<i>) to be written to memory.

In operation, when the control bit CIN<i> is logic level "1", the NMOS transistor (MN3) is turned On, and the differential amplifier generates an output signal on node (B) having a logic level that is approximately opposite to the logic level of the input data DIN(i). The inverter (INV1) inverts the signal on node (B) to output the data bit Data_In<i> (and also changes the voltage level of the bit to output a CMOS-level signal). On the other hand, when the control bit CIN<i> is logic "0", the NMOS transistor (MN3) is turned Off, thereby "masking" the input data DIN(i) from being buffered and output as Data_In<i>. Again, in one exemplary embodiment of the invention, each of the DIN buffers (910~980) of FIG. 12 have the same circuit architecture as depicted in FIG. 13 and operate in the same manner.

Figure 14:
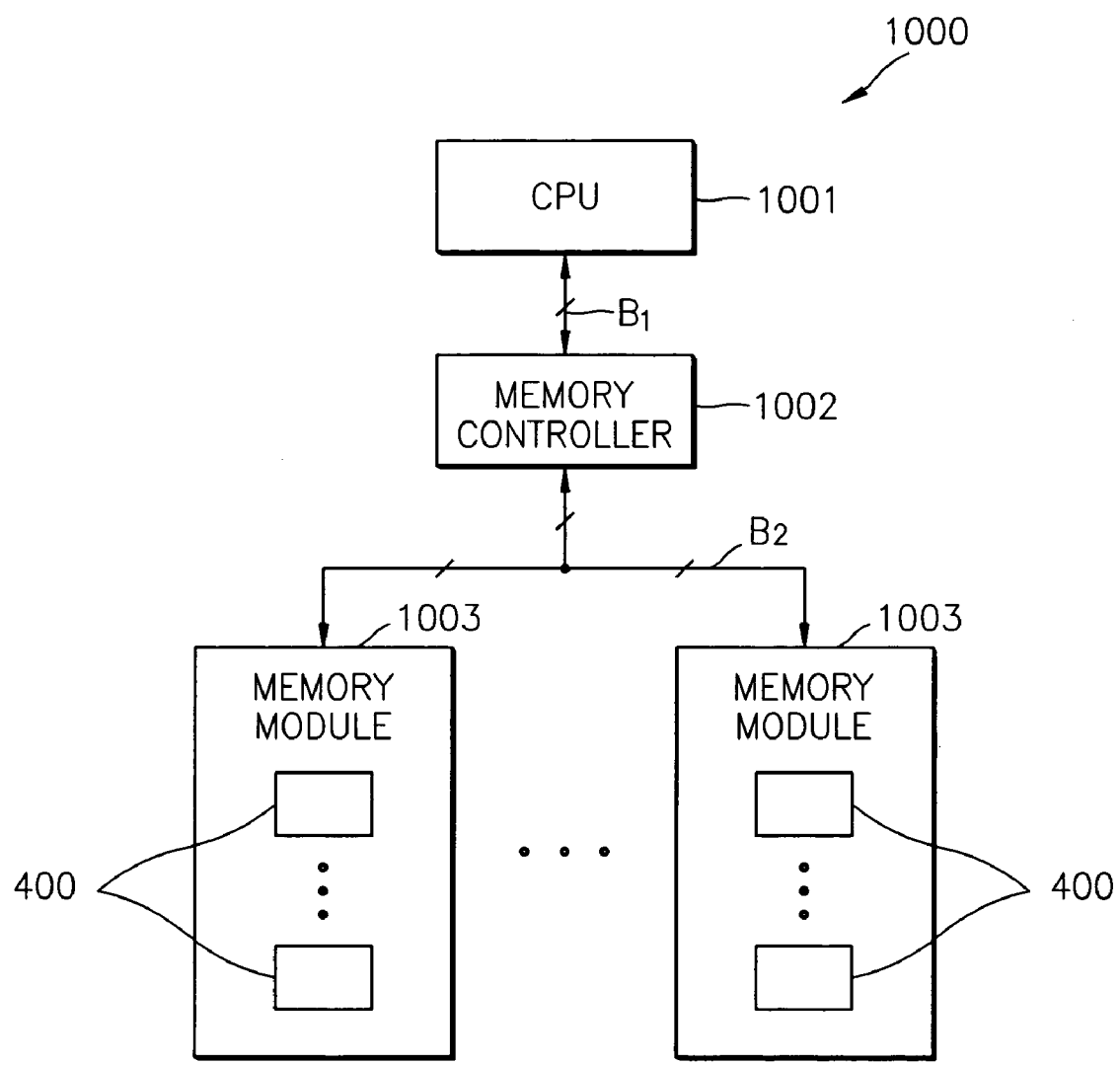
FIG. 14 is a schematic block diagram illustrating a memory system in which the present invention may be implemented.

FIG. 14 is a schematic block diagram illustrating a memory system in which the present invention may be implemented. The memory system (1000) comprises a CPU (1001), memory controller (1002) and a plurality of memory modules (1003). The CPU may be a microprocessor unit (MPU) or network processing unit (NPU), etc. Each memory module (1003) comprises a plurality of semiconductor memory devices (400). The CPU (1001) is connected to the memory controller by a first bus system (B1) (e.g., control bus, data bus, address bus) and the memory controller (1002) is connected the memory modules (1003) via a second bus system (B2) (control bus, data bus, address bus). In the exemplary framework of FIG. 14, the CPU (1001) controls the memory controller (1002) and the memory controller (1002) controls the memory (1003, 400) (although it is to be understood that the CPU can be implemented to directly control the memory, without the use of a separate memory controller).

In the exemplary embodiment of FIG. 14, each memory module (1003) can represent, for example, a memory bank, and each memory device (400) of a given memory module (1003) may represent a semiconductor memory device according to the present invention having control circuitry for providing variable data I/O width, wherein such control circuitry is also located within the memory devices (400).

A memory system according to another embodiment of the present invention may comprise one or more separate semiconductor memory devices (instead of the memory modules having a plurality of memory devices as shown in FIG. 14), and a central processing unit (and no memory controller). In this embodiment, the memory devices communicate directly with the central processing unit. In yet another embodiment, a memory system according to the invention may comprise one or more separate semiconductor memory devices (instead of the memory modules having a plurality of memory devices as shown in FIG. 14) that directly communicate with a memory controller.

Although illustrative embodiments have been described herein with reference to the accompanying drawings, it is to be understood that the invention is not limited to the precise system and method embodiments described herein, and that various other changes and modifications may be affected therein by one skilled in the art without departing form the scope or spirit of the invention. All such changes and modifications are intended to be included within the scope of the invention as defined by the appended claims.

What is claimed is:

1. A semiconductor memory device, comprising:
   an integrated circuit (IC) memory chip comprising an integrated memory circuit and a plurality of address pins, wherein the integrated memory circuit comprises:
   a memory cell array;
   a data buffer for processing data read from or written to the memory cell array; and
   a data width control circuit for selectively controlling a data width of the data buffer in response to one or more address bits of an external address signal applied to one or more address pins of the IC memory chip, wherein the data width control circuit comprises:
   a decoder for decoding the one or more address bits of the external address signal in response to a data access command to generate a first control signal; and
   a data buffer controller, responsive to the first control signal, to generate a second control signal for controlling the data width of the data buffer,
   wherein the decoder comprises:
   a switching circuit; and
   a logic circuit, wherein the switching circuit is responsive to the data access command in the form of a read command and a write command to pass the one or more address bits of the external address signal to the logic circuit and wherein the logic circuit processes the external address signal to generate the first control signal.

2. The device of claim 1, wherein the data width control circuit selectively controls the data width of the data buffer by generating a control signal that masks or unmasks one or more bits of the data buffer.

3. The device of claim 2, wherein a masked bit is prevented from being input to the memory cell array from the data buffer.

4. The device of claim 2, wherein a masked bit is prevented from being output from the data buffer.

5. The device of claim 1, wherein the data buffer has a width of n bits and wherein the data width of the data buffer is selectivety controlled to be n bits or less.

6. The device of claim 1, wherein the logic circuit comprises a plurality of parallel connected AND gates that receive the one or more address bits of the external address signal, and wherein the first control signal comprises a plural bit signal comprised of the output signals from the AND gates.

7. The device of claim 6, wherein the data buffer controller comprises:
   a switching circuit comprising a plurality of parallel connected switches, wherein each switch receives the data access command, and wherein one or more switches are selectively activated in response to the first control signal to generate the second control signal, the second control signal comprise a plural bit signal comprised of the output signals of the switches.

8. A semiconductor memory device, comprising:
an integrated circuit (IC) memory chip comprising an integrated memory circuit and a plurality of address pins, wherein the integrated memory circuit comprises;
a memory cell array;
a data output buffer for outputting data read from the memory cell array;
a data input buffer for inputting data to be written to the memory cell array; and
a data width control circuit for selectively controlling a data width of the data output buffer or the data input buffer in response to one or more address bits of an external address signal applied to one or more of the address pins of the IC memory chip, wherein the data width control circuit comprises:
a decoder which is activated in response to a read command signal or write command signal to decode the one or more address bits of the external address to generate a first control signal;
a data input buffer controller which is activated in response to the write command signal to generate a second control signal for controlling the data width of the data input buffer based on the first control signal; and
a data output buffer controller which is activated in response to the read command signal to generate a second control signal for controlling the data width of the data output buffer based on the first control signal,
wherein the decoder comprises:
a switching circuit; and
a logic circuit, wherein the switching circuit is responsive to the read command signal and the write command signal to pass the one or more address bits of the external address signal to the logic circuit and wherein the logic circuit processes the external address signal to generate the first control signal.

9. The device of claim 8, wherein the data width control circuit selectively controls the data width of the data input buffer or data output buffer by generating a control signal that masks or unmasks one or more bits of the data buffer.

10. The device of claim 9, wherein a masked bit is prevented from being input to the memory cell array from the data input data buffer.

11. The device of claim 9, wherein a masked bit is prevented from being output from the data output buffer.

12. The device of claim 8, wherein the data input and Output buffers have a width of ii bits and wherein the data width of the data buffers are selectively controlled to be n bits or less.

13. The device of claim 8, wherein the logic circuit comprises a plurality of parallel connected AND gates that receive the one or more address bits of the external address signal, and wherein the first control signal comprises a plural bit signal comprised of the output signals from the AND gates.

14. The device of claim 13, wherein the data input buffer controller comprises:
a switching circuit comprising a plurality of parallel connected switchcs, wherein each switch receives the write command signal, and wherein one or more switches are selectively activated in response to the first control signal to generate the second control signal, the second control signal comprising a plural bit signal comprised of the output signals of the switches.

15. The device of claim 13, wherein the data output uffer controller comprises:
a switching circuit comprising a plurality of parallel connected switches, wherein each switch receives the read command signal, and wherein one or more switches are selectively activated in response to the first control signal to generate the second control signal, the second control signal comprising a plural bit signal comprised of the output signals of the switches.

16. An integrated circuit (IC) memory device, comprising:
a memory data buffer;
a data width control circuit for selectively varying a data width of the memory data buffer in response to one or more address bits of an external control signal applied to one or more address pins of the IC memory device; and
a decoder for decoding the one or more address bits of the external address signal in response to a data access command to generate a first control signal; and
a data buffer controller, responsive to the first control signal, to generate a second control signal for controlling the data width of the data buffer,
wherein the decoder comprises:
a switching circuit; and
a logic circuit, wherein the switching circuit is responsive to a data access command in the form of a read command and a write command to pass the one or more address bits of the external address signal to the logic circuit and wherein the logic circuit processes the external address signal to generate the first control signal.

17. A memory system, comprising:
a controller for generating data access command signals and address signals; and
a semiconductor integrated circuit (IC) memory chip comprising:
a plurality of address pins;
a memory cell array;
a data buffer for processing data read from or written to the memory cell array;
a data width control circuit for selectively controlling a data wkith of the data buffer in response to one or more address bits of an external address signal applied to one or more of the address pins of the IC memory chip; and
a decoder for decoding the one or more address bits of the external address signal in response to a data access command to generate a first control signal; and
a data buffer controller, responsive to the first control signal, to generate a second control signal for controlling the data width of the data buffer,
wherein the decoder comprises:
a switching circuit; and
a logic circuit, wherein the switching circuit is responsive to a data access command in the form of a read command and a write command to pass the one or more address bits of the external address signal to the logic circuit and wherein the logic circuit processes the external address signal to generate the first control signal.

18. The system of claim 17, wherein the controller is a microprocessor unit.

19. The system of claim 17, wherein the controller is a network control unit.

20. The system of claim 17, wherein the controller is a memory controller.

21. A method for providing data I/O (input/output) width control in a semiconductor integrated circuit (IC) memory chip, comprising the steps of:

generating a data width control signal in response to one or more address bits of an external address signal applied to one or more address pins of the IC memory chip;

controlling a data width of a memory data buffer in response to the data width control signal to selectively vary a data width of the memory data buffer; and decoding the one or more address bits of the external address signal in response to a data access command to generate a first control signal; and generating, responsive to the first control signal, a second control signal for controlling the data width of the data buffer, wherein the step of decoding comprises:

providing a switching operation; and performing a logic function, wherein the switching operation is responsive to the data access command in the form of a read command and a write command to pass the one or more address bits of the external address signal to the logic function and wherein the logic function processes the external address signal to generate the first control signal.

22. A semiconductor memory device, comprising:

an integrated circuit (IC) memory chip comprising an integrated memory circuit and a plurality of address pins, wherein the integrated memory circuit comprises;

a memory cell array;

a data buffer for processing data read from or written to the memory cell array by a read command or write command;

a data width control circuit for selectively controlling a data width of the data buffer in response to one or more address bits of an external address signal that is accompanied with the read command or write command, and which is applied to one or more of the address pins of the IC memory chip; and a decoder for decoding the one or more address bits of the external address signal in response to a data access command to generate a first control signal; and a data buffer controller, responsive to the first control signal, to generate a second control signal for controlling the data width of the data buffer, wherein the decoder comprises:

a switching circuit; and a logic circuit, wherein the switching circuit is responsive to the a read command and the write command to pass the one or more address bits of the external address signal to the logic circuit and wherein the logic circuit processes the external address signal to generate the first control signal.

23. A semiconductor memory device, comprising:

an integrated circuit (IC) memory chip comprising an integrated memory circuit and a plurality of address pins, wherein the integrated memory circuit comprises;

a memory cell array;

a data buffer for processing data read from or written to the memory cell array by a read command or write command;

a data width control circuit for selectively controlling a data width of the data buffer in response to a one or more address bits of a redundant external address signal that is accompanied with the read command or write command, and which is applied to one or more of the address pins of the IC memory chip, and a decoder for decoding the one or more address bits of the external aidress signal in response to a data access command to generate a first control signal; and a data buffer controller, responsive to the first control signal, to generate a second control signal for controlling the data width of the data buffer, wherein the decoder comprises:

a switching circuit; and a logic circuit, wherein the switching circuit is responsive to the read command and the write command to pass the one or more address bits of the redundant external address signal to the logic circuit and wherein the logic circuit processes the redundant external address signal to generate the first control signal.

* * * * *